United States Patent [19]
Cahill

[11] Patent Number: 5,263,055
[45] Date of Patent: Nov. 16, 1993

[54] APPARATUS AND METHOD FOR REDUCING HARMONIC INTERFERENCE GENERATED BY A CLOCK SIGNAL

[75] Inventor: Stephen V. Cahill, Palatine, Ill.

[73] Assignee: Motorola, Inc., Schaumburg, Ill.

[21] Appl. No.: 787,489

[22] Filed: Nov. 4, 1991

[51] Int. Cl.$^5$ .............. H03D 1/04; H03D 1/06; H03K 5/01; H03K 6/04
[52] U.S. Cl. .............. 375/99; 375/103; 375/1; 455/317
[58] Field of Search .............. 375/1, 96, 99, 103, 375/7; 455/317, 114

[56] References Cited

U.S. PATENT DOCUMENTS

| | | | |
|---|---|---|---|
| 4,247,939 | 1/1981 | Stromswold et al. | 375/103 X |
| 4,425,661 | 1/1984 | Moses et al. | |
| 4,466,107 | 8/1984 | Stoner | 375/7 |
| 4,888,788 | 12/1989 | Teranishi et al. | 375/1 |
| 5,128,957 | 7/1992 | Nakagawa | 375/1 |
| 5,148,447 | 9/1992 | Ito | 375/7 |

FOREIGN PATENT DOCUMENTS 60-229544 11/1985 Japan .

OTHER PUBLICATIONS

RF Design, Apr. 1991, "Designing a Direct Sequence Spread Spectrum Secure Communication System", beginning on p. 31.

Hewlett Packard Journal, Sep. 1980, "Automatic Measurements with High Performance Universal Counter", pp. 21–31.

Primary Examiner—Curtis Kuntz
Assistant Examiner—Bryan Webster
Attorney, Agent, or Firm—Kevin D. Kaschke

[57] ABSTRACT

An apparatus and method therefor substantially reducing the interference of a harmonic frequency component (301) of a clock signal with a filtered received signal (302), comprises a frequency spreading signal generator (127) and a signal modulator (125). The frequency spreading signal generator (127) produces a frequency spreading signal (130). The signal modulator (125) modulates the clock signal, produced by a clock signal generator (129), with the frequency spreading signal (130) to produce a modulated clock signal (131) including a modulated harmonic frequency component (303). The power level of a modulated harmonic frequency component (303), corresponding to the harmonic frequency component interfering with the filtered signal (202–204), is spread over a frequency bandwidth ($f_6$–$f_7$) greater than the predetermined frequency bandwidth ($f_4$–$f_5$) causing the power level of the modulated harmonic frequency component (303) within the predetermined frequency bandwidth ($f_4$–$f_5$) to decrease.

17 Claims, 2 Drawing Sheets

APPARATUS AND METHOD FOR REDUCING HARMONIC INTERFERENCE GENERATED BY A CLOCK SIGNAL

FIELD OF THE INVENTION

The present invention generally relates to clock signals, and more particularly relates to reducing harmonic interference generated by a clock signal.

BACKGROUND OF THE INVENTION

Communication equipment, of which a radiotelephone is a convenient example, provides an appropriate setting for describing the need for the present invention.

Radiotelephones generally comprise audio, logic, and transceiver circuitry. The logic circuitry includes a processor that executes a sequence of predetermined operations, responsive to the predetermined frequency of a reference clock signal, to control the audio and the transceiver circuitry. A high frequency clock signal is usually needed for the processor to execute the operations at a rate required for typical radiotelephone operation.

High frequency clock signals are typically characterized by digital square wave pulses with sharp edges that contain significant spectral energy. The spectral energy produces harmonic frequency components, hereinafter called harmonics, at frequencies that are integral multiplies of the frequency of the clock signal. The harmonics may radiate from lines, carrying the clock signal, interconnecting the logic circuitry.

A common problem in the design of radiotelephones is that the radiated harmonics may interfere with information signals in a bandpass filter in the receiver portion of the transceiver circuitry. Radiated harmonics, falling within the frequency bandwidth of the receiver's bandpass filter, may have a power level that masks or distorts information signals of lesser power level resulting in poor information reception.

Traditional techniques implemented for reducing harmonic interference include shielding the receiver circuitry from the logic circuitry, placing the logic circuitry in a radiotelephone cavity separate from the receiver circuitry, and isolating currents in the receiver circuitry from the logic circuitry. Although these techniques provide adequate solutions, these techniques may require additional parts, consume valuable engineering development time and resources, and/or increase the size of the radiotelephone, all of which increase the cost of the radiotelephone. Furthermore, in the future, desirable smaller radiotelephone housings and higher speed signal processing will increase the likelihood and severity the harmonic interference.

For many situations, of which communication equipment is merely an example, the prior art has not produced an apparatus or method for reducing the power level of harmonics, within a predetermined frequency bandwidth, generated by a clock signal to solve the problem of harmonic interference while providing for the advantage of lower equipment cost.

SUMMARY OF THE INVENTION

A device includes a signal generator and a filter. The signal generator produces a first signal including a fundamental frequency component and harmonic frequency components having power levels. The filter filters a second signal over a predetermined frequency bandwidth to produce a filtered signal. The filtered signal is susceptible to interference from a harmonic frequency component having a frequency within the predetermined frequency bandwidth. An apparatus and method for substantially reducing the interference of the harmonic frequency component with the filtered signal, comprises a frequency spreading signal generator and a signal modulator. The frequency spreading signal generator produces a frequency spreading signal. The signal modulator modulates the first signal with the frequency spreading signal to produce a modulated signal including modulated harmonic frequency components. The power level of a modulated harmonic frequency component, corresponding to the harmonic frequency component interfering with the filtered signal, is spread over a frequency bandwidth greater than the predetermined frequency bandwidth causing the power level of the modulated harmonic frequency component within the predetermined frequency bandwidth to decrease, whereby the interference of the at least one harmonic frequency component with the filtered signal is substantially reduced.

BRIEF DESCRIPTION OF THE DRAWINGS

FIG. 5 shows an alternate block diagram for the computer shown in FIG. 1.

DETAILED DESCRIPTION OF A PREFERRED EMBODIMENT

Figure 1:
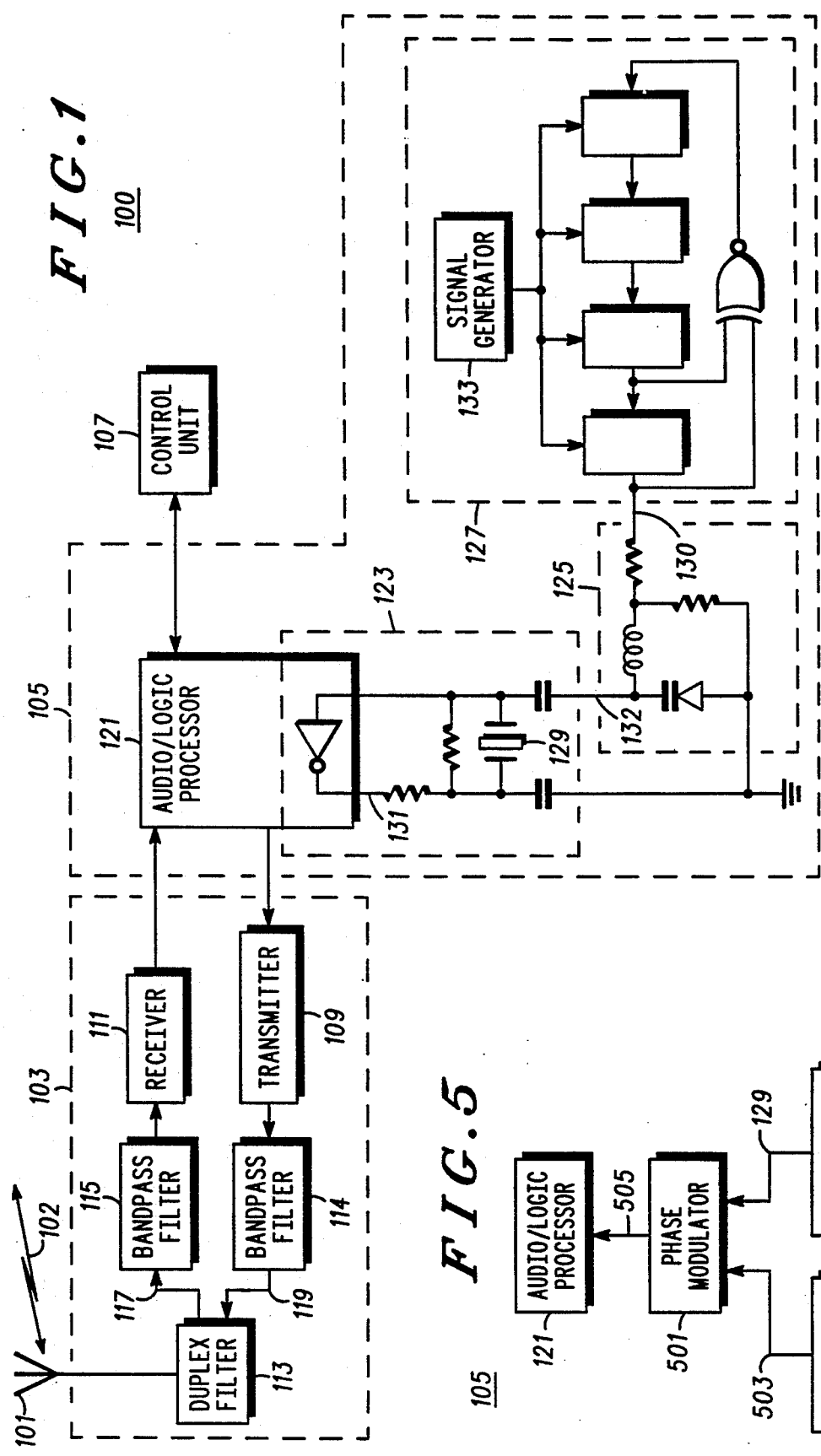
FIG. 1 shows a block diagram for explaining the cooperative relationship of the electronic parts of a radiotelephone constructed in accordance with the teachings and principles of the present invention.

FIG. 1 shows a block diagram for explaining the cooperative relationship of the electronic parts of communication equipment 100, such as a portable cellular radiotelephone, to which the present invention may be applied. By way of example, a detailed description of the electronic parts used to operate the radiotelephone 100 may be found in an Instruction Manual for the Dyna TAC Cellular Portable Telephone, part no. 68P81071E55-O, published and available from Motorola Inc. C & E Parts, 1301 E. Algonquin Rd., Schaumburg Ill. 60195. The design of the radiotelephone 100 may be similar to the design in U.S. Pat. No. 315,346, entitled "Portable Radiotelephone or Similar Article".

The radiotelephone generally comprises a wireless communication element 101, a transceiver 103, a computer 105 and a control unit 107. The wireless communication element 101, for example a conventional antenna, is coupled to the transceiver 103 providing a path for information signals 102 coupled therebetween. The transceiver 103 transmits and/or receives the information signals 102. The computer 105 controls the transceiver 103 and/or the control unit 107, responsive to input signals from the same. The control unit 107 provides a user interface for the radiotelephone 100. The control unit 107 may comprise a display, a keypad, an earpiece and/or a microphone (all not shown).

The transceiver 103 comprises a transmitter 109, a receiver 111, a duplex filter 113, and bandpass filters 114 and 115. The information signals 102 are coupled to the duplex filter 113 via the antenna 101. The duplex filter 113 separates the receive and transmit frequency bandwidths such that a information signal at line 117 may be received at the same time another information signal at line 119 is transmitted. The information signal, at line 117, is coupled to the receiver 111 via a bandpass filter 115, having a relatively narrow predetermined band of frequencies at which the receiver 111 is designed to operate while rejecting all other frequencies. Likewise, the information signal, at line 119, is coupled to the transmitter 109 via a bandpass filter 114, having a relatively narrow predetermined band of frequencies at which the transmitter 109 is designed to operate while rejecting all other frequencies.

The computer 105 generally comprises a clock signal generator 123, an audio/logic processor 121, a pseudorandom noise signal generator 127, and a frequency modulator 125. The clock signal generator 123 comprises a conventional oscillator 129, such as a crystal oscillator, and associated bias circuitry. The clock signal generator 123 produces a clock signal, having a predetermined frequency, at line 131. The clock signal at line 131 is a reference signal that provides the timing for the audio/logic processor 121.

The audio/logic processor 121, for example a digital signal processor (DSP), comprises means for executing a sequence of predetermined operations (otherwise known as a program), responsive to the predetermined frequency of the clock signal at line 131. By way of example, the DSP may be a DSP/56001, described in DSP/56001 Digital Signal Processor User Manual, revision 1, available from Motorola Inc. The frequency of the clock signal at line 131, for example 8 MHz, is such that the operations may be executed at a rate required for typical operation of the radiotelephone 100. The clock signal at line 131 may be characterized by digital square wave pulses with sharp edges that contain significant spectral energy producing the aforementioned harmonics.

The pseudorandom noise generator 127 produces a frequency spreading signal at line 130 that is a deterministic, periodic signal and appears to have the statistical properties of white noise. A detailed description of pseudorandom noise generators may be found in "Digital Communications, Fundamentals and Applications" by Bernard Sklar, Chapter 10, ©1988, published by Prentice Hall.

The frequency spreading signal at line 130 is combined with an input to the clock signal generator at line 132 via the frequency modulator 125. A detailed description of the frequency modulator may be found in "Solid State Radio Engineering" by Herert L. Krauss, Charles W. Bostian and Frederick H. Rabe, Chapter 15, pp. 483–485, ©1980, published by John Wiley and Sons, Inc.

By frequency modulating the input to the clock signal generator at line 132 with the frequency spreading signal at line 130, the power of the harmonics are spread over a frequency bandwidth, greater than the predetermined frequency bandwidth of the receiver's bandpass filter whereby the power level of a harmonic passed through the bandwidth of the receiver's bandpass filter, is reduced. The power level of the harmonic, filtered by the receiver's bandpass filter 115, is reduced so as not to mask or distort a received information signal at line 117. The result yields improved reception of the received information signal at line 117, without using the aforementioned traditional techniques for reducing harmonic interference, while providing for the advantage of lower equipment cost.

A convenient enhancement to the radiotelephone 100 of FIG. 1 is to replace a signal generator 133 in the pseudorandom noise signal generator 127 using a binary division of the clock signal at line 131. Thus, only a single signal generator, i.e. the clock signal generator 123, is needed to generate both the reference clock signal at line 131 and the frequency spreading signal at line 130.

Figure 2:
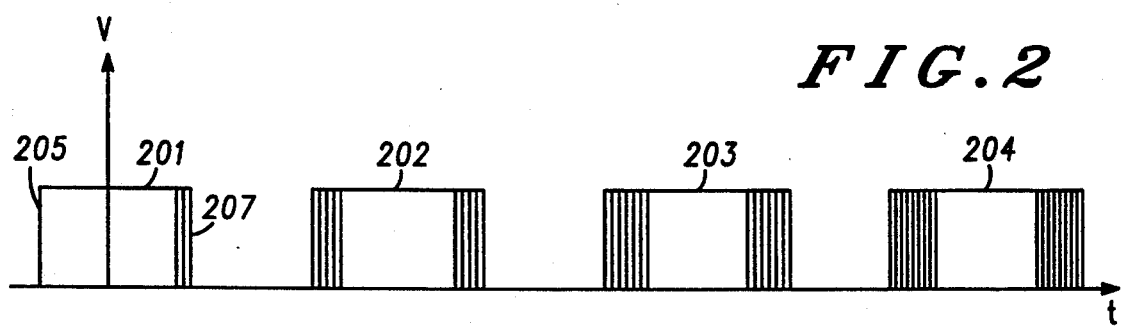
FIG. 2 is an oscillogram plot in the time domain of a frequency modulated clock signal generated by the clock signal generator of FIG. 1, by way of example and not by way of limitation.

FIG. 2 is an oscillogram plot in the time domain of the frequency modulated clock signal at line 131 generated by the clock signal generator 123 of FIG. 1, by way of example and not by way of limitation. The plot shows four pulses 201–204 of the clock signal at line 131. Each pulse has a rising and a falling edge, 205 and 207, respectively, on pulse 201 for example. The rising and falling edges of each pulse 202–204 are spread over time. By way of example, 1.5 KHz deviation modulated on the 8 MHz clock signal corresponds to 190 ppm of jitter on the clock signal at line 131. This amount of jitter is sufficient for reducing the power spectral density of the harmonics without substantially affecting the timing of the audio/logic processor 121. FIG. 2 shows the amount of jitter increasing for pulses 201 through 204. Increasing uncertainty of edge location is due to increasing accumulation of jitter with increasing accumulation of time from the leading edge of the reference pulse 205.

Figure 3:
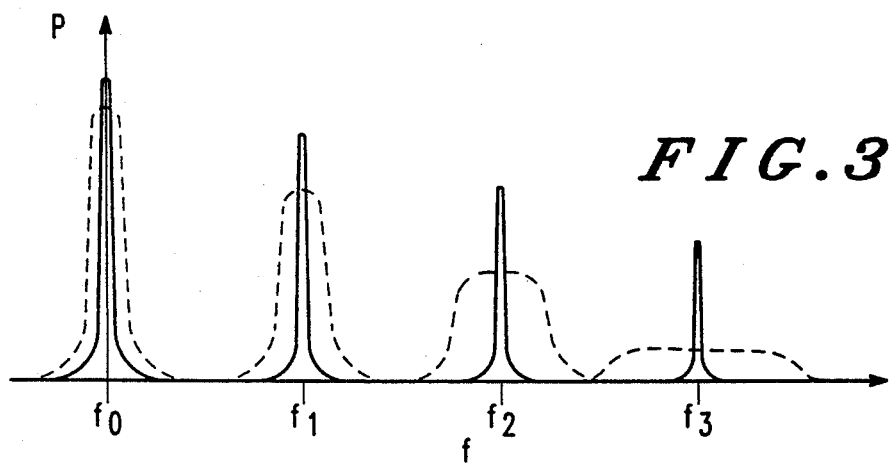
FIG. 3 is a plot in the frequency domain of the clock signal as shown in FIG. 2, by way of example and not by way of limitation.

FIG. 3 is a plot in the frequency domain of the clock signal at line 131 as shown in FIG. 2, by way of example and not by way of limitation. The clock signal at line 131 has a fundamental frequency, $f_0$, and harmonics $f_1$, $f_2$ and $f_3$. The solid and dotted lines, corresponding to $f_0$–$f_3$, represent the plot in the frequency domain of the clock signal at line 131 before and after being modulated, respectively, by the frequency spreading signal at line 130. The effect of modulating the clock signal at line 131 with the frequency spreading signal at line 130 is that the fundamental frequency $f_0$ of the clock signal and its harmonics $f_1$–$f_3$ are spread over the plurality of frequencies, i.e. a bandwidth wider than the predetermined bandwidth of the receiver's bandpass filter, such that the power spectral density of any one harmonic, within the bandpass filter 115, is reduced.

The power of the modulated harmonic remains equal to the power of the unmodulated harmonic such that the total power of the harmonic is conserved. As the frequency of the harmonics increase, the spectral spreading of the modulated harmonic as a percentage of the unmodulated harmonic bandwidth increases. Thus, for higher order harmonics the power spectral density reduction of the modulated harmonic as a percentage of the unmodulated harmonic is greater than for lower order harmonics.

Figure 4:
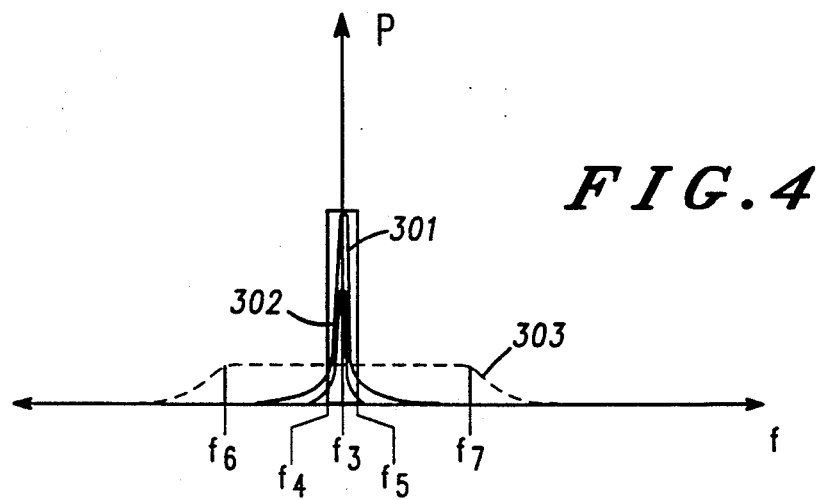
FIG. 4 is a plot in the frequency domain of the harmonic, at $f_3$ in FIG. 3, interfering with a received information signal in the receiver's bandpass filter of FIG. 1.

FIG. 4 is a plot in the frequency domain of the receiver's bandpass filter 115 and the unmodulated harmonic 301 at $f_3$ interfering with a received information signal 302 at line 117. The receiver's bandpass filter 115 occupies a frequency bandwidth from $f_4$ to $f_5$, for example 10 KHz. The power spectral density of the signals, within the bandpass filter 115, is represented by the area underneath the curves, representing signals 301-303, between frequencies $f_4$ and $f_5$.

The unmodulated harmonic 301 has a power spectral density at $f_3$, within the bandpass filter 115, that masks the power spectral density of the received information signal 302 from the receiver 111. By frequency modulating the clock signal at line 131, the power spectral density of the unmodulated harmonic 301 is spread over a plurality of frequencies in the frequency bandwidth between $f_6$ and $f_7$. The effect of such spectral spreading is that the power of the unmodulated harmonic 301, intercepted by the bandwidth of the bandpass filter 115, is reduced to a power level, represented by the modulated harmonic 303, below the power level of the received information signal 302. Consequently, the received information signal 302 can now be detected by the receiver 111.

After the spreading of the unmodulated harmonic 301, the frequency bandwidth between $f_6$ and $f_7$ of the modulated harmonic 303 is substantially greater than the frequency bandwidth between $f_4$ and $f_5$ of the receiver's bandpass filter 115. Thus, the power spectral density of the harmonic within the bandpass filter 115 is substantially reduced. A power level reduction of a modulated harmonic relative to an unmodulated harmonic, within a predetermined frequency bandwidth, may be represented by:

$$\text{Power (dB)} = 10 \log \left( \frac{W}{2nx} \right)$$

where n is the order of the harmonic, x is the amount of modulation and W is the bandwidth of the bandpass filter 115. By way of example, a 100th order harmonic having 1.5 KHz modulation provides 14.77 dB power reduction, relative to an unmodulated 100th order harmonic, within a bandpass filter having a 10 KHz bandwidth.

FIG. 5 shows an alternate block diagram for the computer 105 shown in FIG. 1, constructed in accordance with the teachings and principles of the present invention. A conventional phase modulator 501 is used as the means for combining the frequency spreading signal at line 130 and the unmodulated clock signal at line 503. A phase modulated clock signal at line 505 provides the timing for the audio/logic processor 121. Thus, the clock signal is phase modulated in FIG. 5 to reduce the power spectral density of a harmonic, within the receiver's bandpass filter 115, generated by the clock signal generator 123. A detailed description of conventional phase modulators may be found in "Solid State Radio Engineering" by Herbert L. Krauss, Charles W. Bostian and Frederick H. Rabe, Chapter 15, pp. 485-486, ©1980, published by John Wiley and Sons, Inc.

I claim:

1. In a device that includes a signal generator and a filter, wherein the signal generator produces a first signal including a fundamental frequency component and harmonic frequency components having power levels, wherein the filter filters a second signal over a predetermined frequency bandwidth to produce a filtered signal, and wherein the filtered signal is susceptible to interference from at least one of the harmonic frequency components having a frequency within the predetermined frequency bandwidth, an apparatus for substantially reducing the interference of the at least one harmonic frequency component with the filtered signal, the apparatus comprising:

a frequency spreading signal generator for producing a frequency spreading signal; and a signal modulator for modulating the first signal with the frequency spreading signal to produce a modulated signal including modulated harmonic frequency components, wherein the power level of at least one modulated harmonic frequency component, corresponding to the at least one harmonic frequency component interfering with the filtered signal, is spread over a frequency bandwidth greater than the predetermined frequency bandwidth causing the power level of the at least one modulated harmonic frequency component within the predetermined frequency bandwidth to decrease, whereby the interference of the at least one harmonic frequency component with the filtered signal is substantially reduced.

2. An apparatus in accordance with claim 1 wherein the filter further comprises a bandpass filter.

3. An apparatus in accordance with claim 1 wherein the signal generator that produces a first signal further comprises an oscillator producing a reference clock signal.

4. An apparatus in accordance with claim 1 wherein the frequency spreading signal generator further comprises a pseudorandom noise signal generator.

5. An apparatus in accordance with claim 1 wherein the signal modulator further comprises a frequency modulator.

6. An apparatus in accordance with claim 1 wherein the signal modulator further comprises a phase modulator.

7. Communication equipment including a receiver for receiving a modulated signal, comprising:

a signal generator for producing a first signal including a fundamental frequency component and harmonic frequency components having power levels;

a filter, in the receiver, for filtering the modulated signal over a predetermined frequency bandwidth to produce a filtered signal, wherein the filtered signal is susceptible to interference from at least one of the harmonic frequency components having a frequency within the predetermined frequency bandwidth;

a frequency spreading signal generator for producing a frequency spreading signal; and a signal modulator for modulating the first signal with the frequency spreading signal to produce a modulated signal including modulated harmonic frequency components, wherein the power level of at least one modulated harmonic frequency component, corresponding to the at least one harmonic frequency component interfering with the filtered signal, is spread over a frequency bandwidth greater than the predetermined frequency bandwidth causing the power level of the at least one modulated harmonic frequency component within the predetermined frequency bandwidth to decrease, whereby the interference of the at least one harmonic frequency component with the filtered signal is substantially reduced.

8. Communication equipment in accordance with claim 7 wherein the signal generator that produces a first signal further comprises an oscillator producing a reference clock signal.

9. Communication equipment in accordance with claim 7 wherein the frequency spreading signal generator further comprises a pseudorandom noise signal generator.

10. Communication equipment in accordance with claim 7 wherein the signal modulator further comprises a frequency modulator.

11. Communication equipment in accordance with claim 7 wherein the signal modulator further comprises a phase modulator.

12. In a device that includes a signal generator and a filter, wherein the signal generator produces a first signal including a fundamental frequency component and harmonic frequency components having power levels, wherein the filter filters a second signal over a predetermined frequency bandwidth to produce a filtered signal, and wherein the filtered signal is susceptible to interference from at least one of the harmonic frequency components having a frequency within the predetermined frequency bandwidth, a method for substantially reducing the interference of the at least one harmonic frequency component with the filtered signal, the method comprising the steps of:

producing a frequency spreading signal; and modulating the first signal with the frequency spreading signal to produce a modulated signal including modulated harmonic frequency components, wherein the power level of at least one modulated harmonic frequency component, corresponding to the at least one harmonic frequency component interfering with the filtered signal, is spread over a frequency bandwidth greater than the predetermined frequency bandwidth causing the power level of the at least one modulated harmonic frequency component within the predetermined frequency bandwidth to decrease, whereby the interference of the at least one harmonic frequency component with the filtered signal is substantially reduced.

13. A method in accordance with claim 12 wherein the frequency spreading signal further comprises a pseudorandom noise signal.

14. A method in accordance with claim 12 wherein the step of modulating further comprises the step of frequency modulating.

15. A method in accordance with claim 12 wherein the step of modulating further comprises the step of phase modulating.

16. A method in accordance with claim 12 wherein the filter further comprises a bandpass filter.

17. A method in accordance with claim 12 wherein the step of producing the first signal further comprises the step of producing a reference clock signal.

* * * * *